United States Patent
Toonen et al.

(10) Patent No.: US 9,666,729 B2
(45) Date of Patent: May 30, 2017

(54) NANO STRUCTURED PARAELECTRIC OR SUPERPARAELECTRIC VARACTORS FOR AGILE ELECTRONIC SYSTEMS

(71) Applicant: U.S. Army Research Laboratory ATTN: RDRL-LOC-I, Adelphi, MD (US)

(72) Inventors: Ryan C. Toonen, Belcamp, MD (US); Mathew P. Ivill, Havre de Grace, MD (US); Melanie W. Cole, Churchville, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 14/490,777

(22) Filed: Sep. 19, 2014

(65) Prior Publication Data
US 2016/0087111 A1  Mar. 24, 2016

(51) Int. Cl.
*H01L 29/06* (2006.01)
*H01L 29/93* (2006.01)
*H01L 29/66* (2006.01)

(52) U.S. Cl.
CPC .......... *H01L 29/93* (2013.01); *H01L 29/0676* (2013.01); *H01L 29/66174* (2013.01)

(58) Field of Classification Search
CPC ......... H01L 29/16; H01L 29/66; H01L 27/24; H01L 27/115; H01L 29/06; H01L 29/93; H01L 29/66174; H01L 29/068; H01L 29/0673

USPC .................................................. 257/13, 599
See application file for complete search history.

(56) References Cited

U.S. PATENT DOCUMENTS

| | | | |
|---|---|---|---|
| 2009/0025215 A1* | 1/2009 | Murakami | G02F 1/136227 29/846 |
| 2015/0048292 A1* | 2/2015 | Park | H01L 27/2454 257/2 |

* cited by examiner

Primary Examiner — Chuong A Luu
(74) Attorney, Agent, or Firm — Christos S. Kyriakou

(57) ABSTRACT

An electronic device in the form a two-dimensional array of nanopillars extending generally normal to a substrate is provided. The nanopillars are made from a paraelectric or superparaelectric material. In addition, a linear dielectric medium is located between individual nanopillars. A two-dimensional array of paraelectric or superparaelectric nanopillars and a linear dielectric medium form the effective dielectric medium of a paraelectric or superparaelectric varactor. In some instances, the nanopillars are cylindrical nanopillars that have an average diameter and/or average height/length between 1-300 nanometers. In other instances, the nanopillars are quasi-nanoparticles that form self-aligned nano-junctions. In addition, each of the nanopillars has a single paraelectric or superparaelectric dipole domain therewithin. As such, each of the nanopillars can be void of crystallographic defects, polycrystallinity, interactions between ferroic domains, and defects due to ferroic domain walls.

16 Claims, 2 Drawing Sheets

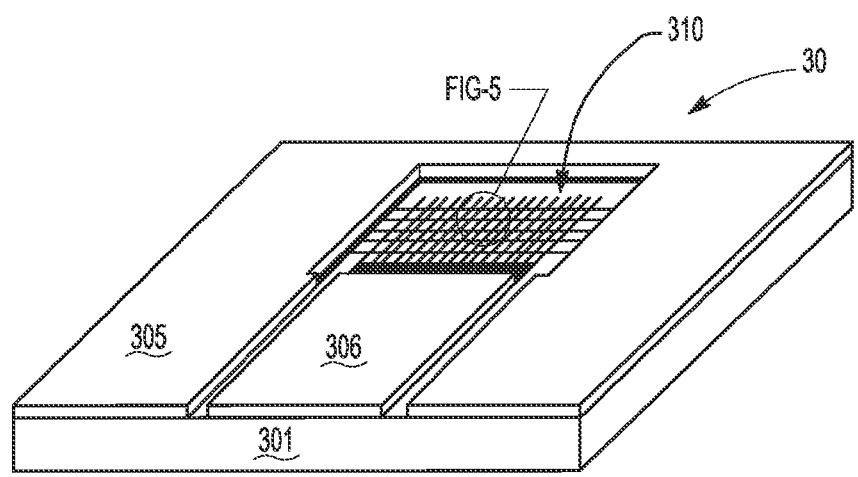
Fig-4
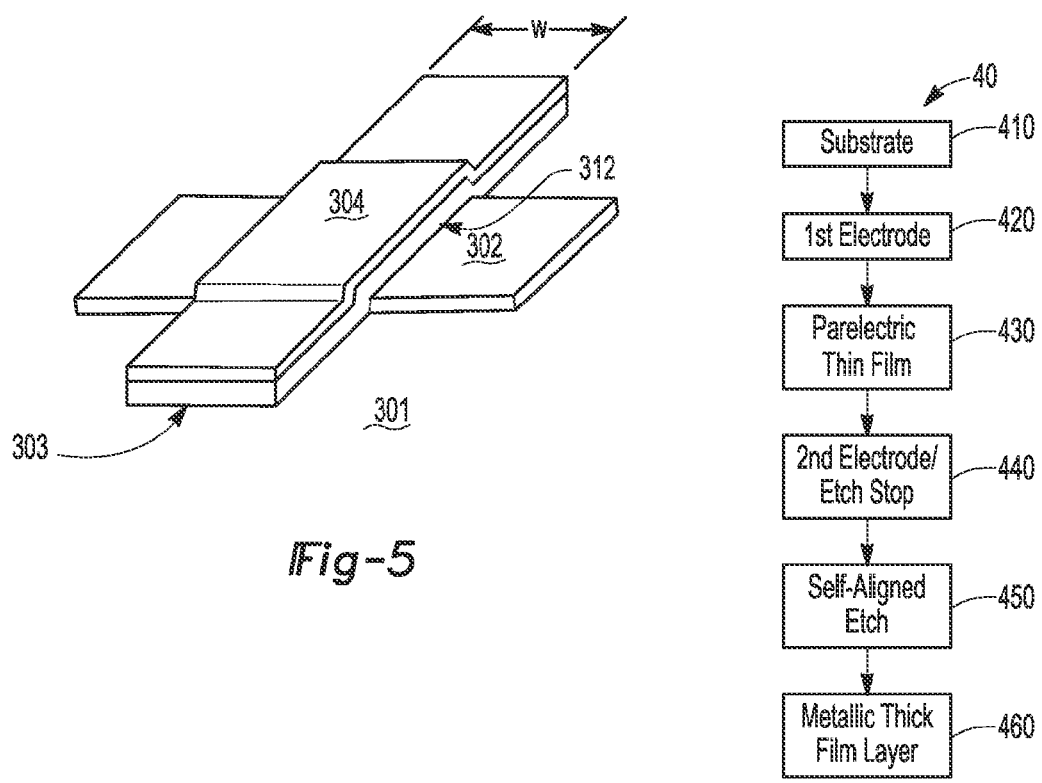
Fig-5
Fig-6

NANO STRUCTURED PARAELECTRIC OR SUPERPARAELECTRIC VARACTORS FOR AGILE ELECTRONIC SYSTEMS

GOVERNMENT INTEREST

The invention described herein may be manufactured, used, and licensed by or for the United States Government.

FIELD OF THE INVENTION

The present invention relates in general to paraelectric and/or superparaelectric varactors, and in particular to nanostructured paraelectric and/or superparaelectric varactors.

BACKGROUND OF THE INVENTION

Agile thin film varactors that incorporate complex oxide materials with a paraelectric phase are known. The most commonly used materials include barium strontium titanate, strontium titanate, and the like. It is also known that dopants such as magnesium and lanthanum have been used to enhance desired performance properties such as tunability or to reduce undesired performance properties such as microwave power loss. In addition, temperature stability characteristics have been improved by grading thin film dopant concentrations or growing dopant-stratified heterostructures. However, the nano-structuring of such devices has been limited to the thickness of the thin films. As such, varactors provide increased tunability, reduced power losses, etc., would be desirable.

SUMMARY OF THE INVENTION

An electronic device in the form of a paraelectric and/or superparaelectric varactor is provided. The electronic device has a substrate and a two-dimensional array of nanopillars that extend generally normal to the substrate. The nanopillars are made from a material with a paraelectric and/or superparaelectric phase. In addition, a linear dielectric medium is located between individual nanopillars. A two-dimensional array of paraelectric or superparaelectric nanopillars and a linear dielectric medium form the effective dielectric medium of a paraelectric or superparaelectric varactor.

In some instances, the nanopillars are cylindrical nanopillars that have an average diameter between 1-300 nanometers (nm) and an average height between 1-300 nm. In other instances, the nanopillars are quasi-nanoparticles formed by self-aligned nano-junctions. In addition, each of the nanopillars has a single paraelectric or superparaelectric dipole domain therewithin. As such, each of the nanopillars can be void of crystallographic defects, polycrystallinity, interactions between ferroic domains, and defects due to ferroic domain walls.

The electronic device can have a first electrode and a second electrode, the first electrode extending across the substrate and located between the substrate and the two-dimensional array of nanopillars. The second electrode extends across the two-dimensional array of nanopillars such that the two-dimensional array of nanopillars is located between the first electrode and the second electrode. A metal adhesion layer can be located between the substrate and the first electrode and the electronic device may or may not have metallic pillar caps located between the nanopillars and the second electrode.

The two-dimensional array of nanopillars can be electrically connected in a parallel configuration in order to form a micron-sized varactor. In some instances, the nanopillars are electrically connected in the parallel configuration to form a millimeter-sized varactor. Also, the linear dielectric medium can be in the form of an amorphous solid material or an ambient gas medium, and the paraelectric and/or superparaelectric varactor can be a parallel-plate varactor.

In other instances, the two-dimensional array of nanopillars extending from the substrate is a freestanding two-dimensional array of nanopillars. For the purpose of the present invention, a freestanding two-dimensional array of nanopillars is a two-dimensional array of nanopillars that has one end attached to a structure, e.g. a substrate or electrode, and another end that is not attached to a structure. A metallic thick film layer can extend across the substrate but does not overlap the freestanding two-dimensional array of nanopillars. For example, the freestanding nanopillars can be located within a gap of an interdigital finger capacitor (IDC)-style varactor. The freestanding two-dimensional array of nanopillars may or may not be grown directly on the substrate and the linear dielectric medium can be room air, vacuum, or hermetically sealed gas. The metallic thin film layer can be in the form of a first electrode and a second electrode that are configured as IDC-style varactor electrodes.

In still other instances, the nanopillars are in the form of quasi-nanoparticles that form self-aligned nano-structures. In such instances, the electronic device has a plurality of narrow bottom electrode strips and a plurality of narrow top electrode strips that are arranged or configured in a cross-hatch pattern that extends across the substrate. The term cross-hatch pattern refers to two or more sets of intersecting lines. Also, each set of interesting lines may or may not be a set of parallel lines. The plurality of narrow bottom electrode strips extending in a first direction and the plurality of narrow top electrode strips extend in a second direction such that the top electrode strips overlap the bottom electrode strips at overlapping regions. In addition, the quasi-nanoparticles are located between the plurality of narrow bottom electrode strips and the plurality of narrow top electrode strips at the overlapping regions.

Such an electronic device can have a coplanar ground line and a coplanar signal line. In addition, the coplanar ground line and the coplanar signal line can be made from a metallic thick film. The plurality of narrow bottom electrode strips can be electrically connected to the coplanar ground line and the plurality of narrow top electrode strips can be electrically connected to the coplanar signal line.

A process for making an electronic device is also included; the process includes providing a substrate and growing a two-dimensional array of nanopillars onto the substrate. The nanopillars are made from a paraelectric or superparaelectric material and have a linear dielectric medium located between individual nanopillars. A first electrode and a second electrode are provided; the first electrode and second electrode being proximate to the two-dimensional array of nanopillars. Also, the two-dimensional array of nanopillars, linear dielectric medium, first electrode, and second electrode form a paraelectric or superparaelectric varactor.

In some instances, the first electrode is arranged on the substrate and the two-dimensional array of nanopillars is grown onto the first electrode. Then, the second electrode is arranged onto the two-dimensional array of nanopillars such that a parallel-plate varactor is formed.

In other instances, the first electrode and the second electrode are placed onto the substrate and are in the form of an IDC-style varactor. In such instances, the two-dimensional array of nanopillars may or may not be freestanding nanopillars that are grown on the substrate and within a gap between the first electrode and the second electrode.

In still other instances, the first electrode is in the form of a plurality of narrow bottom electrode strips and the second electrode is in the form of a plurality of narrow top electrode strips. The first electrode and the second electrode are produced such that they are arranged in a cross-hatch pattern that extends across the substrate. In addition, after the bottom electrode strips have been arranged on the substrate, the two-dimensional array of nanopillars that are in the form of quasi-nanoparticles are arranged onto a top surface of the bottom electrode strips. Then, the top electrode strips are arranged across the substrate and overlap the bottom electrode strips at overlapping regions. As such, at least a subset of the quasi-nanoparticles is located between the bottom electrode strips and the top electrode strips within the overlapping regions and provides a plurality of parallel connected quasi-nanoparticles. As stated above, the plurality of narrow bottom electrode strips can be electrically connected to a first electrode and the plurality of narrow top electrode strips can be electrically connected to a second electrode.

BRIEF DESCRIPTION OF THE DRAWINGS

FIG. 4 is a schematic illustration of a perspective for a paraelectric and/or superparaelectric varactor according to yet another embodiment of the present invention;

FIG. 5 is a schematic illustration of an enlarged perspective view for circled region labeled FIG. 5 in FIG. 4; and FIG. 6 is a flow chart for a process according to an embodiment of the present invention.

DETAILED DESCRIPTION OF THE INVENTION

Figure 1:
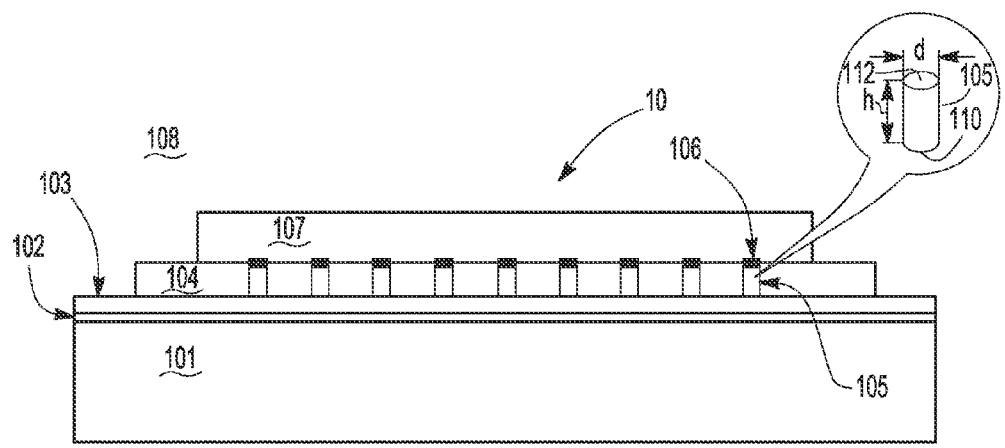
FIG. 1 is a schematic illustration of a side view for a paraelectric and/or superparaelectric varactor according to an embodiment of the present invention.

Nano-structured paraelectric and/or superparaelectric varactors are provided. The varactors include the use of electrically insulating media composed of individual non- or weakly-interacting nanometer-scale crystals that can be electrically connected in parallel configurations such as to provide or yield micrometer- and millimeter-scale varactors. Such varactors have effective net capacitances that are large enough for use in radio and microwave frequency applications but yet have physical properties observed only at the nanometer scale. Such a novel configuration offers a reduction of non-ideal device characteristics resulting from polycrystallinity, interactions between multiple ferroic domains, and effects due to ferroic domain walls.

The relatively large surface area-to-volume ratio of the nano-engineered materials increases the effectiveness of annealing techniques intended to reduce crystallographic defects. The enhanced critical device characteristics of the nano-engineered paraelectric and/or superparaelectric varactors include reduced power loss, increased small-signal linearity, increased signal-to-noise ratio, increased agility, increased tunability, increased memoryless-ness, decreased temperature sensitivity, increased fabrication reproducibility, and increased design reliability. System applications that directly benefit from the nano-engineered paraelectric and/or superparaelectric varactors include tunable filters, tunable resonators, tunable phase shifters, tunable delay lines, tunable impedance matching networks, voltage controlled oscillators and the like. It is appreciated that such components are necessary for the realization of agile communication networks composed of software-defined reconfigurable radios, phased array radars, beam steering antennas, etc.

The varactors are formed from a plurality of single grain nanopillars, or in some instances nanopillars having just a few crystallographic grains. Each nanopillar operates in the limit of a single or a few ferroic domains. It is appreciated that ferroic behavior implies physical characteristics observed in bulk materials such as paraelectricity, ferroelectricity, piezoelectricity, pyroelectricity, ferroelasticity, paramagnetism, and ferromagnetism. Ferroic behavior also includes phenomena due to artificial structuring of materials at the nanometer scale including superparaelectricity, superparamagnetism, and multiferroic effects. Also, it is appreciated that ferroic domains are physical regions of uniform polarization or magnetization.

The nanometer-scale varactors disclosed herein exhibit a reduction of non-ideal device characteristics resulting from polycrystallinity, interactions between ferroic domains, and effects due to ferroic domain walls. By virtue of their inherently large surface area-to-volume ratios, the nanometer-scale varactors exhibit an enhanced effectiveness of post-fabrication surface annealing treatments that are designed to reduce the number of crystallographic defects within the device. In addition, stresses on nano-scale pillars made from ferroelectric materials, as described in more detail below, can be optimized by controlling the dimensions of the ferroic-substrate and/or ferroic-metal interfaces and the aspect ratios of the nanopillars themselves. In some instances, the nanometer-scale pillars are cylindrical shaped pillars and have an average diameter and/or average height/length within the range of 1-300 nm.

The physical properties of the nanopillars can be tailored by controlling the material composition thereof, grading the composition, and employing heterostructured layers. Naturally, controlling the material composition includes controlling the concentration of accepter or donor dopants. The nanopillars can be made from any ferroelectric material known to those skilled in the art and ferroelectric materials that are not yet known but may be invented in the future. Known ferroelectric materials include barium strontium titanate, barium titanate, lead titanate, lead zirconate titanate, triglycine sulfate, polyvinylidene fluoride (PVDF), lithium tantalate, and the like.

Micrometer- and millimeter-scale varactors can be made from connecting in parallel a plurality of nanometer-scale paraelectric and/or superparaelectric varactors. Such micrometer- and millimeter-scale varactors exhibit drastically improved characteristics that are critical for the realization of high quality radio and microwave frequency devices used in electronic circuit applications. In particular, such nano-engineered paraelectric and/or superparaelectric varactors provide reduced power loss that is achieved by the reduction of leakage current and alternating current loss mechanisms that arise from crystallographic defects, polycrystallinity, interactions between ferroic domains, and effects due to ferroic domain walls.

The nano-engineered paraelectric and superparaelectric varactors disclosed herein provide increased small-signal linearity which is achieved by the reduction of loss mechanisms arising from the same factors stated above, i.e. crystallographic defects, polycrystallinity, interactions between ferroic domains, and effects due to ferroic domain walls. The small signal linearity implies that alternating current signals processed by a device operating around a direct current bias point lose minimal power to the generation of undesired harmonic or intermodulation distortions. The nano-engineered paraelectric and/or superparaelectric varactors also provide increased signal-to-noise ratio, agility, tunability, memoryless-ness, and temperature sensitivity due to the same factors discussed above.

The nano-structured varactors disclosed herein can be used in the fields of radio and microwave frequency device technology intended for agile signal processing applications. Such applications include critical military systems that use agile communication networks composed of software-defined reconfigurable radios. Other systems include phased array radar and electronically scanned phased antennas which offer beam-steering capability that rely heavily on the use of tunable, phase-shifter technologies.

Competing technologies for realizing reliable phase shifters with fast tuning characteristics include semiconducting diodes, magnetic-field (B-field) tuned ferrites, and micro-electromechanical systems (MEMS). A summary comparing the figures-of-merit for the state-of-the-art phase-shifter technologies is provided in Table 1 below.

nas rather than traditional dish antennas. Traditional dish antennas are mechanically steered by gimbals that suffer from long response times and are slow to acquire and maintain a signal lock. Additionally, dish antennas must be housed in bulky radomes that are not well suited for low-profile applications.

Current state of the art for electronically scanned phased antennas uses semiconducting diodes as the varactor technology. However, such types of varactors have a severe bandwidth limitation on the system-level performance of the antenna due to undesirable phase noise characteristics. As such, electronically scanned phased arrays require active cooling and additional signal processing electronics. Such additional hardware not only drives up the manufacturing cost of such an antenna system, but also increases its power load and thus its overall size and weight.

The development of such systems has only recently been able to offer X-band (8 to 12 GHz) performance. Due to the phase noise issues associated with semiconducting diode varactor technology, Ku-band (12 to 18 GHz) operation of OTM electronically scanned phased array antennas has not yet been achieved even though WGS satellites provide service on both the X- and Ku-bands.

Varactors based on paraelectric thin film technology offer phase noise characteristics that are superior to any other varactor technology. However, the use of paraelectric thin film technology has been limited due to its unreliability associated with memory effects and signal loss.

| | Type | | | |
|---|---|---|---|---|
| Feature | Traditional Paraelectric | Semiconducting Diodes | B-Field Tuned Ferrites | MEMS |
| Cost | Low | Expensive | Very expensive | Low |
| Reliability | Good after $10^6$ 0-40 V/μm bias cycles (more tests required) | Very good (if properly package) | Excellent | Good after several billion cycles (more tests required) |
| Power handling | Good, >1 W | Very Good, tens of watts | Very high (kW) | Low Power, <50 mW for high reliability |
| Switching speed | Intrinsically fast (≈ns), controller limited if high voltage | Fast at low power ($<10^{-9}$ s) | Slow (inductance) 10 to 100 μs | Slow (mechanical) 10 to 100 μs |
| Radiation tolerance | Excellent | Poor (good if radiation hardened) | Excellent | Excellent (mechanical; no solid state junctions involved) |
| DC power consumption | Low (<<1 μA current) μW | Low (<10 mW for diodes; negligible for FETs) | High (large current) ≈10 W (≈1 W if latching) | negligible |
| RF loss | ~5 dB/36°@ K-band | ~2 dB/bit@Ka-band = 8 dB | <1 dB/360°@X-band | ~2.3 dB/337.5°@Ka-band |
| Size | Very small if parallel-plate varactor ($mm^2$) | Small (≈10 $mm^2$ at Ka-band) | Large (waveguide, bias coil) | Small (comparable to MMIC) |
| Linearity | IMD intersect +60 dBm | IMD intersect +35 to +40 dBm | | IMD intersect +80 dBm |

The advantages provided by traditional paraelectric thin film technology include relatively small biasing voltages (<30 volts), relatively fast agility (<1 nanosecond), and moderately high quality factors (>100). A clear disadvantage of this technology is unreliability due to memory effects such as thermal hysteresis.

It is appreciated that hardware and software systems that allow for ground, air, and sea on-the-move (OTM) communication with wideband global SATCOM (WGS) satellites are currently being developed. Such systems are being developed with electronically scanned phased array antennas In response, the instant invention essentially incorporates the use of nanometer-scale varactors that are coupled together to form micron- and millimeter-size varactors that have the properties of the nanometer-scale subcomponents/varactors. The nano-engineered varactors include a substrate and a two-dimensional array of nanopillars that extend generally normal to the substrate. The nanopillars are made from a paraelectric or superparaelectric material. In addition, a linear dielectric medium is located between individual nanopillars. Also, the substrate, the two-dimensional array of nanopillars, and the linear dielectric medium form a paraelectric and/or superparaelectric varactor. The nanopillars are dimensioned such that a single paraelectric and/or superparaelectric dipole domain is contained therewithin and thus the undesirable effects of interactions between ferroic domains and ferroic domain walls are reduced or eliminated. In addition, with such small scale features, crystallographic defects and polycrystallinity are reduced and/or eliminated.

In some instances, the paraelectric or superparaelectric varactor has a first electrode and a second electrode. The first electrode extends across the substrate and is located between the substrate and the two-dimensional array of nanopillars. The second electrode extends across the two-dimensional array of nanopillars such that the nanopillars are located between the first electrode and the second electrode. Such a device is naturally a parallel-plate varactor. Such a device can also have a metal adhesion layer that may or may not be attached to the substrate and is located between the substrate and the bottom electrode. The nanopillars may or may not have metallic pillar caps that are located between the nanopillars and the top electrode. Also, the linear dielectric medium can be in the form of an amorphous solid material or an ambient gas medium.

Another embodiment of a nano-engineered paraelectric and/or superparaelectric varactor includes a freestanding two-dimensional array of nanopillars. The freestanding nanopillars can be located within a gap of an interdigital finger capacitor (IDC)-style varactor, i.e. the freestanding nanopillars can be located within a gap between a first electrode that is spaced apart from a second electrode.

In yet another embodiment, the plurality of nanopillars are in the form of quasi-nanoparticles that form self-aligned nano junctions between a narrow bottom electrode strip and a narrow top electrode strip. In such an embodiment, a plurality of narrow bottom electrode strips and a plurality of top electrode strips are arranged or configured in a cross-hatch pattern that extends across the substrate. The plurality of narrow bottom electrode strips extend in a first direction and the plurality of narrow top electrode strips extend in a second direction such that the top electrode strips overlap the bottom electrode strips at overlapping regions. In addition, quasi-nanoparticles are located between the bottom electrode strips and the top electrode strips at the overlapping regions. Finally, the bottom electrode strips can be electrically connected to a coplanar ground line and the top electrode strips can be electrically connected to a coplanar signal line or vice-versa.

Turning now to FIG. 1, an embodiment of a paraelectric and/or superparaelectric varactor according to an embodiment of the present invention is shown generally at reference numeral 10. The varactor 10 has a substrate 101 and an optional metallic adhesion layer 102 extending across the substrate 101. Extending across the substrate 101 and the optional metallic adhesion layer 102 is a metallic bottom electrode 103. Also, extending generally normal to the metallic bottom electrode layer 103 is a plurality of nanometer-scale pillars 105 made from a paraelectric or superparaelectric material. The plurality of nanometer-scale pillars 105 forms a two-dimensional array of nanometer-scale pillars. Located between each of the nanopillars 105 is a linear dielectric medium 104 that can be an amorphous solid material or an ambient medium such as air, a vacuum, hermetically sealed gas, and the like.

In some instances, the nanometer-scale pillars 105 have a metallic pillar cap 106. In addition, a metallic top electrode layer 107 extends across the plurality of nanopillars 105. Finally, the varactor 10 can be surrounded by an ambient medium 108 that is in the form of room air, vacuum, hermetically sealed gas or vacuum, and the like.

Each of the pillars 105 has a first end 110 and a second end 112. It is appreciated that the first end 110 can be in physical and/or electrical contact with the bottom electrode layer 103 and the second end 112 can be in physical and/or electrical contact with the metallic pillar cap 108 and/or top electrode layer 107. Also, the metallic adhesion layer 102, bottom electrode layer 103 and/or top electrode layer 107 can be manufactured, arranged and/or placed onto the device 10 using any electronic or microelectronic fabrication technique or process known to those skilled in the art. For example and illustrative purposes only, the layers can be deposited onto the device using physical vapor deposition techniques, chemical vapor deposition techniques, wet chemistry techniques, etc.

As shown in the figure, the nanopillars 105 can be in the form of a cylindrical nanopillar; however this shape is not required. Also, when the nanopillars 105 are in the shape of a cylindrical form, the nanopillars have a diameter "d" and a height "h". The nanopillars 105 can have a diameter that ranges from 1-300 nm and a height that ranges from 1-300 nm. It should be appreciated that the diameter d and the height h can be engineered and manufactured such that desirable physical and/or mechanical properties from the nanopillars 105 and the varactor 10 are provided. For example, the size of each of the nanopillars 105 can be such that each pillar is a single crystal and/or contains only one dipole domain, and thus does not have interaction between ferroic domains and/or effects due to ferroic domain walls therewithin.

The size of the substrate 101 and the combination of the plurality of nanopillars 105 can be dimensioned such that micron- and millimeter-size varactors are produced. In addition, a plurality of varactors 10 can be connected in parallel to produce micron- and/or millimeter-size varactors.

It is appreciated that in order for microwave devices to be used effectively as circuit components, their impedance magnitudes should be comparable to their circuits' transmission line impedances. In most monolithic microwave integrated circuits (MMICs), the transmission line impedance is 50 ohms ($\Omega$). In most circumstances, a varactor designed to process microwave signals would have an impedance value comparable in magnitude to this value. For example, for signal with a frequency of 10 GHz, a varactor with a capacitance value within an order of magnitude of 318 femtoFarads might be employed. However, a single 100 nm diameter nano-varactor fabricated from a 100 nm thick thin film composed of barium strontium titanate, with a 60:40 ratio of Ba:Sr and an approximate dielectric constant of 200, would yield a capacitance value on the order of 100 attoFarad. Therefore, micron- and millimeter-scale varactors are realized by the present invention by electrically connecting multiple nanometer scale paraelectric varactors in parallel as illustrated in the figure. With such a configuration, a micron-scale varactor with a capacitance near 318 femtoFarad is constructed from a plurality of nano-varactors, e.g. on the order of 3000 nano-varactors. The individual nanopillars are non- or weakly-interacting with respect to each other. Collectively, the plurality of nanopillars produce a large device with properties only present in structures with nanometer-scale dimensions as discussed above.

Figure 2:
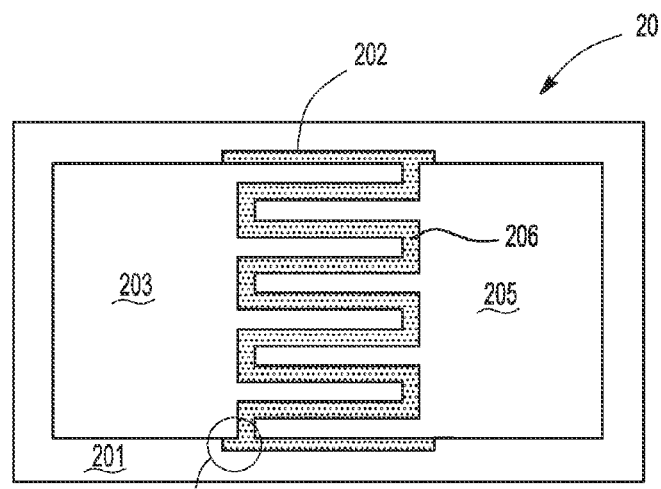
FIG. 2 is a schematic illustration of a top view for a paraelectric and/or superparaelectric varactor according to another embodiment of the present invention.
Figure 3:
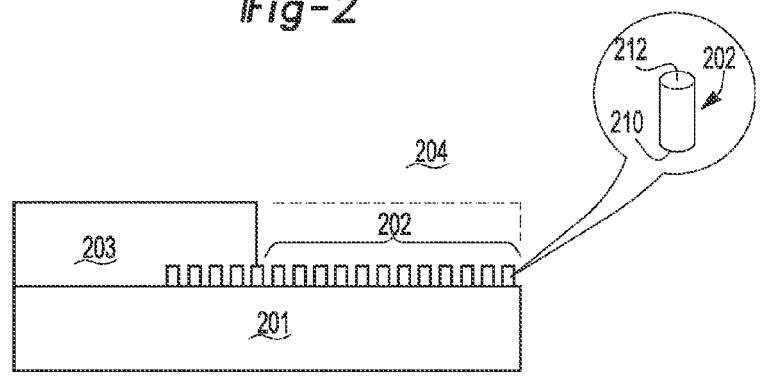
FIG. 3 is a schematic illustration of a side view for a portion of the paraelectric and/or superparaelectric varactor shown in FIG. 2.

Turning now to FIGS. 2 and 3, another embodiment of a paraelectric or superparaelectric varactor according to an embodiment of the present invention is shown generally at reference numeral 20. The varactor 20 is in the form of an IDC-style varactor with a plurality of nanopillars 202 being freestanding nanopillars located within a gap 206, e.g. a serpentine shaped gap, between a first electrode 203 and a second electrode 205. The nanopillars 202, first electrode 203, and second electrode 205 can be located on a substrate 201. It should be appreciated that the freestanding nanopillars 202 can have a first end 210 that is attached to a structure, e.g. the substrate 201, and a second end 212 that is not attached to a structure. In addition, reduced material stress due to the nanopillars 202 freestanding nature can be afforded.

It is appreciated that the embodiment illustrated in FIGS. 2-3 features a coplanar interdigital finger configuration that can be better suited for applications that require small capacitance values. In general, the interdigital finger configuration can offer net capacitance values on the order of 500 times smaller than parallel-plate configurations. As such, thousands of freestanding nanopillars 202, which may or may not be grown directly on the support substrate 201, situated in the gaps of an interdigital finger capacitor provide improved properties compared to state of the art IDC-style capacitors.

Turning now to FIGS. 4-5, another embodiment of a nano-engineered varactor is shown generally at reference numeral 30. The varactor 30 can have a substrate 301 and a cross-hatch pattern 310 that is made from a plurality of bottom electrodes 302 and top electrodes 304. The bottom electrodes 302 extend in a first direction and the top electrodes 304 extend in a second direction such that the top electrodes 304 overlap the bottom electrodes 302 at distinct overlapping regions 312. Within the overlapping regions 312 can be junctions made from a material 303 with a paraelectric and/or superparaelectric phase having nanometer-scale height and width that provide a capacitance formed between the bottom electrodes 302 and the top electrode 304 within the overlapping regions 312. Such individual junctions are referred herein as "quasi-nanoparticles."

The bottom electrodes 302 and top electrodes 304 can be of a nano-scale width 'w'. In addition, the bottom electrodes 302 can be electrically connected to a metallic thick film layer 305 which may or may not provide a coplanar ground line or a coplanar signal line. Also, the plurality of top electrodes 304 can be electrically connected to a metallic thin film layer 306 which may or may not form a coplanar signal line or a coplanar ground line.

With respect to fabrication, the design illustrated in FIGS. 4-5 affords for the plurality of nanometer-scale wide bottom electrodes 302 to be placed, deposited, grown, etc. onto the substrate 301 and then a nanometer-scale thick film 312 composed of material that has a paraelectric or superparaelectric phase can be deposited, grown, etc. over the entire surface of the substrate 301 and bottom electrodes 302. The film is then selectivity etched and self-aligned nanometer-scale wide top electrodes 304 are placed, deposited, grown, etc., thereon in order to provide nanometer-scale wide junctions using the parallel array of bottom electrodes 302, material 303 and top electrodes 304. In some instances, the metallic thick film layer 305 and metallic thick film layer 306 may or may not be present when the plurality of quasi-nanoparticles 303 are placed, deposited, grown, etc. onto the substrate 301 and bottom electrodes 302. In any event, after the nanometer-scale thick film 312 has been placed, deposited, grown etc. onto the top electrode 302, the plurality of top electrodes 304 can be placed, deposited, grown etc. onto the device 30 such that the top electrodes 304 overlap the bottom electrodes 302 as illustrated in FIG. 5.

It is appreciated that the embodiment illustrated in FIGS. 4-5 has an effective parallel-plate configuration. However, rather than being composed of individual nanopillars, the design relies on the use of quasi-nanoparticles that provide self-aligned nano-junctions. Although the nano-structuring of the material used in such a configuration is only applied in spatial two dimensions, the device performance still offers superior characteristics in comparison to traditional paraelectric and/or superparaelectric varactors. In addition, the advantage offered by such a design is less complexity and lower fabrication cost since such a device requires fewer fabrication steps than a design such as the one illustrated in FIG. 1.

A process for manufacturing such paraelectric or superparaelectric varactors is also included and disclosed herein. The process is illustratively shown in FIG. 4 at reference numeral 40. The process 40 includes providing a substrate at step 410 and providing a first electrode at step 420. A thin film having a paraelectric phase is then deposited over the bottom electrode at step 430. A second electrode, that will serve as a self-aligned etch stop, is then fabricated over the paraelectric thin film at step 440. The plurality of nanopillars is provided at step 450 during a self-aligned etch in which all of the paraelectric thin film that is not protected by the second electrode is removed. In some cases, this nanostructuring step will change the phase of the nanopillar material from paraelectric to superparaelectric as a result of reducing the size of the material to the nanometer-scale in all three spatial dimensions.

The plurality of nanopillars can be arranged or configured between the first electrode and the second electrode as illustrated in the embodiments of FIGS. 1-5 such that a paraelectric and/or superparaelectric varactor is provided. The first electrode, second electrode, nanopillars, and the like are provided using any method or technique known to those skilled in the art such as physical vapor deposition methods, chemical vapor deposition methods, wet chemistry methods, electronic circuit methods, and the like. Stated differently, one skilled in the art will have knowledge of microelectronic and nano-scale fabrication techniques that can be used to fabricate paraelectric and/or superparaelectric varactors disclosed herein. Finally, in step 460, a metallic thick film layer is added that connects a signal line to the second electrode and a coplanar ground line to the first electrode so that the device will be integratable with micron- or millimeter-scale circuitry.

Regarding the substrates 101, 201 and 301, such substrates can be made from any material known to those skilled in the art, illustratively including dielectric materials, e.g. sapphire, quartz alumina, etc.; high resistance semiconductor materials, e.g. silicon, gallium arsenide, gallium nitride, etc.; insulating polymers; and/or composite materials, e.g. commercially available circuit board material.

Given the above, the above described embodiments, examples, etc. have been provided for illustrative purposes only and are not meant to limit the scope of the invention in any way. Changes, modifications, and the like will be apparent to those skilled in the art and yet still fall within the scope of the invention. Therefore, the scope of the invention is provided by the claims and all equivalents thereof.

REFERENCE NUMERAL LIST

| | |
|---|---|
| 10 - $1^{ST}$ embodiment | 40 - $4^{th}$ embodiment - flowchart |

-continued

| | |
|---|---|
| 101 - substrate | 410 - $1^{st}$ step |
| 102 - metallic adhesion layer | 420 - $2^{nd}$ step |
| 103 - bottom electrode | 430 - $3^{rd}$ step |
| 104 - linear dielectric medium | 440 - $4^{th}$ step |
| 105 - nanopillar | 450 - $5^{th}$ step |
| 106 - metallic nanopillar cap | 460 - $6^{th}$ step |
| 107 - top electrode | |
| 108 - ambient medium | |
| 110 - $1^{st}$ end of nanopillar | |
| 112 - $2^{nd}$ end of nanopillar | |
| 20 - $2^{nd}$ embodiment | |
| 201 - substrate | |
| 202 - nanopillar | |
| 203 - $1^{st}$ electrode | |
| 204 - ambient medium | |
| 205 - $2^{nd}$ electrode | |
| 206 - gap between $1^{st}$ and $2^{nd}$ electrodes | |
| 210 - $1^{st}$ end of nanopillar | |
| 212 - $2^{nd}$ end of nanopillar | |
| 30 - $4^{th}$ embodiment | |
| 301 - substrate | |
| 302 - narrow bottom electrode | |
| 303 - material with paraelectric or superparaelectric phase | |
| 304 - top electrode | |
| 305 - metallic thick film layer | |
| 306 - metallic thick film layer | |
| 310 - cross-hatch pattern | |
| 312 - overlapping region | |

We claim:

1. An electronic device comprising:
   a substrate;
   a two-dimensional array of nanopillars extending generally normal to said substrate, said nanopillars made from a paraelectric or superparaelectric material;
   a linear dielectric medium located between individual nanopillars of said two-dimensional array of nanopillars;
   said substrate, two-dimensional array of nanopillars and linear dielectric medium forming a paraelectric or superparaelectric varactor.

2. The electronic device of claim 1, wherein said nanopillars have an average diameter between 1-300 nm and an average height between 1-300 nm.

3. The electronic device of claim 2, wherein each of said nanopillars has a single paraelectric or superparaelectric dipole domain therewithin.

4. The electronic device of claim 3, further comprising a first electrode and a second electrode, said first electrode extending across said substrate and located between said substrate and said two-dimensional array of nanopillars, said second electrode extending across said two-dimensional array of nanopillars such that said two-dimensional array of nanopillars are located between said first electrode and said second electrode.

5. The electronic device of claim 4, wherein said nanopillars are electrically connected in a parallel configuration to form a micron-sized varactor.

6. The electronic device of claim 5, wherein said nanopillars are electrically connected in said parallel configuration to form a millimeter-sized varactor.

7. The electronic device of claim 4, wherein said paraelectric or superparaelectric varactor is a parallel-plate varactor.

8. The electronic device of claim 3, wherein said two-dimensional array of nanopillars extending from said substrate is a freestanding two-dimensional array of nanopillars.

9. The electronic device of claim 8, further comprising a metallic thick film layer extending across said substrate, said metallic thick film layer not overlapping said freestanding two-dimensional array of nanopillars such that said two-dimensional array of nanopillars is located within a gap of an interdigital finger capacitor (IDC)-style varactor.

10. The electronic device of claim 9, wherein said freestanding two-dimensional array of nanopillars is grown directly on said substrate.

11. The electronic device of claim 1, wherein said nanopillars are quasi-nanoparticles that form self-aligned nano-junctions.

12. The electronic device of claim 11, further comprising a plurality of narrow bottom electrode strips and a plurality of narrow top electrode strips arranged or configured in a cross-hatch pattern extending across said substrate, said plurality of narrow bottom electrode strips extending in a first direction and said plurality of narrow top electrode strips extending in a second direction and overlapping said plurality of narrow bottom electrode strips at overlapping regions, said quasi-nanoparticles located between said plurality of narrow bottom electrode strips and said plurality of narrow top electrode strips at said overlapping regions.

13. The electronic device of claim 12, further comprising a coplanar ground line and a coplanar signal line.

14. The electronic device of claim 13, wherein said coplanar ground line and said coplanar signal line are made from a metallic thick film.

15. The electronic device of claim 12, wherein said plurality of narrow bottom electrode strips are electrically connected to said coplanar ground line and said plurality of narrow top electrode strips are electrically connected to said coplanar signal line.

16. An electronic device comprising:
   a substrate;
   a two-dimensional array of nanopillars extending generally normal to said substrate, said nanopillars made from a paraelectric or superparaelectric material and having a form selected from the group consisting of pillars with an average diameter between 1-300 nm and an average height between 1-300 nm, quasi-nanoparticles and combinations thereof;
   a linear dielectric medium located between individual nanopillars of said two-dimensional array of nanopillars;
   a first electrode and a second electrode, said two-dimensional array of nanopillars located between said first electrode and said second electrode;
   said substrate, two-dimensional array of nanopillars, linear dielectric medium, first electrode and second electrode forming a paraelectric or superparaelectric varactor selected from the group consisting of a parallel-plate varactor or an interdigital capacitor (IDC)-style varactor.

* * * * *